United States Patent
Hummel et al.

(10) Patent No.: US 12,062,867 B2
(45) Date of Patent: Aug. 13, 2024

(54) CONNECTOR COMPRISING A GUIDE PLATE

(71) Applicant: Robert Bosch GmbH, Stuttgart (DE)

(72) Inventors: Daniel Hummel, Reutlingen (DE); Hannes Kahlhammer, Remseck a. Neckar (DE); Hugo Alberto Ramirez Villalobos, Ciudad Juarez (MX); Marton Gondics, Cegled (HU)

(73) Assignee: ROBERT BOSCH GMBH, Stuttgart (DE)

( * ) Notice: Subject to any disclaimer, the term of this patent is extended or adjusted under 35 U.S.C. 154(b) by 279 days.

(21) Appl. No.: 17/639,457

(22) PCT Filed: Oct. 23, 2020

(86) PCT No.: PCT/EP2020/079868
§ 371 (c)(1),
(2) Date: Mar. 1, 2022

(87) PCT Pub. No.: WO2021/099059
PCT Pub. Date: May 27, 2021

(65) Prior Publication Data
US 2022/0344862 A1    Oct. 27, 2022

(30) Foreign Application Priority Data
Nov. 20, 2019    (DE) .................. 10 2019 217 862.6

(51) Int. Cl.
*H01R 13/502*    (2006.01)
*H01R 12/58*    (2011.01)

(52) U.S. Cl.
CPC ........... *H01R 13/502* (2013.01); *H01R 12/58* (2013.01)

(58) Field of Classification Search
CPC ............................. H01R 13/502; H01R 12/58
(Continued)

(56) References Cited

U.S. PATENT DOCUMENTS 3,185,952 A * 5/1965 Potter .................. H01R 12/58
439/79
3,641,641 A * 2/1972 Busler ................ H01R 13/501
29/745
(Continued)

FOREIGN PATENT DOCUMENTS

DE    1031007 B    5/1958
DE    10310077 A1    10/2003
(Continued)

OTHER PUBLICATIONS

International Search Report for PCT/EP2020/079868, Issued Jan. 26, 2021.

*Primary Examiner* — Abdullah A Riyami
*Assistant Examiner* — Vladimir Imas
(74) *Attorney, Agent, or Firm* — NORTON ROSE FULBRIGHT US LLP; Gerard A. Messina

(57) ABSTRACT

A connector, in particular an electrical connector. The connector includes a guide plate, which is configured to be electrically insulating, and a plurality of electrical contact wires, which are in particular stamped, in particular contact pins. The contact wire has an angular, in particular quadrilateral, cross section and is guided through an aperture in the guide plate and projects from the guide plate. In a direction extending through the thickness of the guide plate, the aperture includes a guide shaft. The guide shaft includes at least one planar wall, for guiding a flat side of the contact wire. The guide shaft also includes, on the opposite side to the planar wall, at least one wall region that extends obliquely to it and is configured to touch a corner of the contact wire.

13 Claims, 3 Drawing Sheets

(58) Field of Classification Search
USPC .......................................................... 439/695
See application file for complete search history.

(56) References Cited

U.S. PATENT DOCUMENTS

| | | | | |
|---|---|---|---|---|
| 4,832,611 A * | 5/1989 | Noda | ...................... | H01R 12/58 |
| | | | | 439/70 |
| 4,836,808 A * | 6/1989 | Mallet | ...................... | H01R 4/30 |
| | | | | 439/813 |
| 5,116,263 A | 5/1992 | Bennett et al. | | |
| 6,004,158 A * | 12/1999 | Ward | ................. | H01R 13/6215 |
| | | | | 439/752 |
| 6,109,935 A * | 8/2000 | Yang | .................... | H01R 12/725 |
| | | | | 439/80 |
| 6,783,385 B2 * | 8/2004 | Rudy | ................. | H01R 4/48365 |
| | | | | 439/438 |
| 6,837,745 B2 * | 1/2005 | Takada | ................. | H01R 13/562 |
| | | | | 439/694 |
| 7,004,766 B2 * | 2/2006 | Chen | ...................... | H05K 3/306 |
| | | | | 439/701 |
| 7,367,818 B2 * | 5/2008 | Sakamoto | ............ | H01R 12/725 |
| | | | | 439/79 |
| 7,588,455 B2 * | 9/2009 | Matsumura | .......... | H01R 13/631 |
| | | | | 439/357 |
| 7,938,651 B2 * | 5/2011 | Hanyu | ................... | H01R 12/58 |
| | | | | 439/541.5 |
| 8,923,003 B2 * | 12/2014 | Schlaupitz | ............. | H01R 12/57 |
| | | | | 361/741 |
| 9,761,969 B2 * | 9/2017 | Kishibata | ................. | H05K 3/34 |
| 9,843,116 B2 * | 12/2017 | Endo | .................... | H01R 12/585 |
| 9,979,150 B2 * | 5/2018 | Hwang | ................ | H01R 33/74 |
| 10,454,193 B2 * | 10/2019 | Iwasaki | ................. | H01R 13/05 |
| 10,455,712 B1 * | 10/2019 | Malecke | ............... | H01R 13/518 |
| 10,757,847 B2 * | 8/2020 | Maemuko | ............ | H01R 4/308 |
| 10,770,819 B2 * | 9/2020 | Yamanaka | ............ | H01R 43/16 |
| 2005/0085109 A1 | 4/2005 | Tanaka et al. | | |
| 2008/0176454 A1 | 7/2008 | Imai | | |

FOREIGN PATENT DOCUMENTS

| | | |
|---|---|---|
| EP | 1950841 A2 | 7/2008 |
| GB | 2219148 A | 11/1989 |
| JP | 2019033012 A | 2/2019 |
| JP | 2019075371 A | 5/2019 |

\* cited by examiner

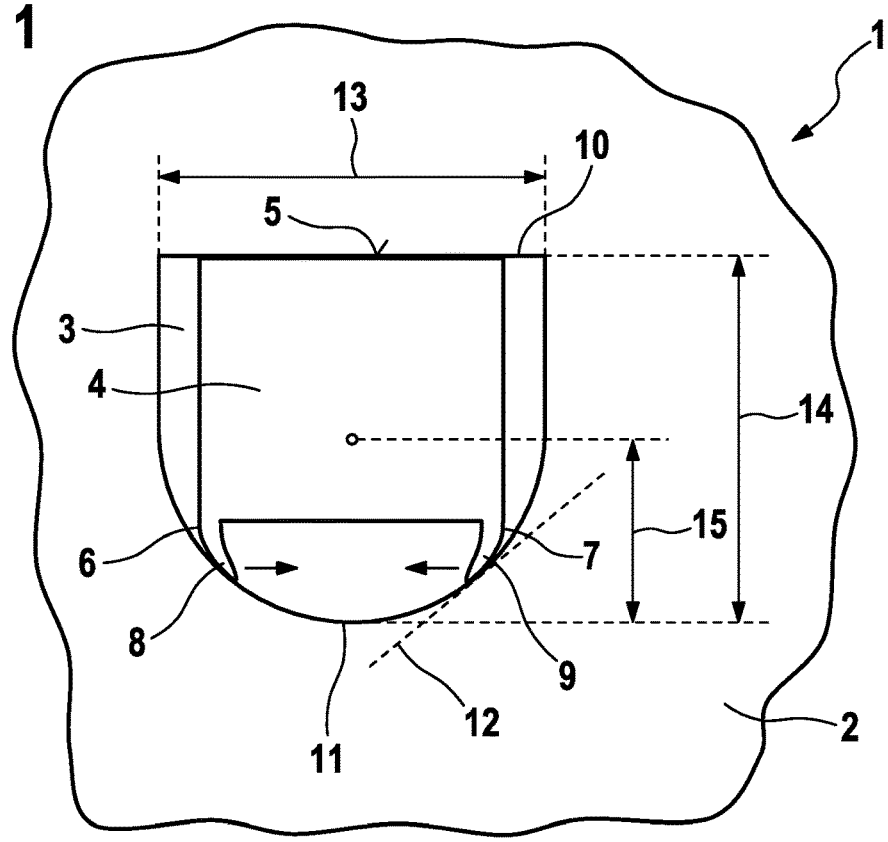
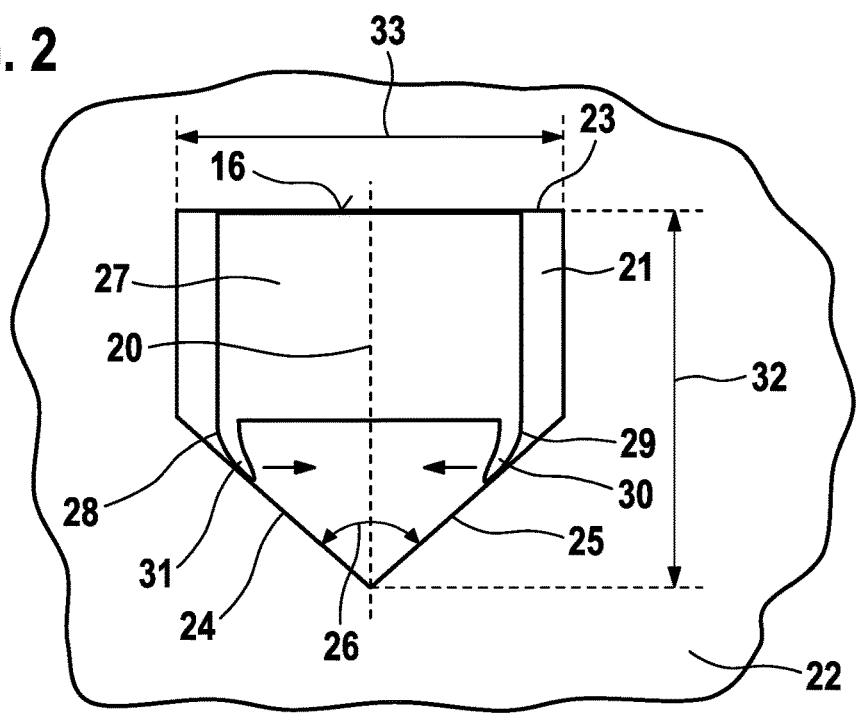

CONNECTOR COMPRISING A GUIDE PLATE

FIELD

The present invention relates to a connector, in particular an electrical connector, comprising a guide plate, which is configured to be electrically insulating. The connector includes a plurality of electrical contact wires, which are in particular stamped, in particular contact pins. The contact wire has an angular, in particular quadrilateral, cross section and is guided through an aperture in the guide plate and projects from the guide plate.

BACKGROUND INFORMATION

U.S. Pat. No. 7,004,766 B2 describes a guide plate for contact wires of a connector, the guide plate including apertures for guiding contact wires through, and the apertures having an oval or rhomboid insertion funnel and a correspondingly shaped aperture.

In the case of connectors comprising stamped contact wires that are configured to be soldered to an aperture in a printed circuit board, burrs that were generated on the contact wire at the time of stamping may break off or become detached as they are inserted into the printed circuit board, or as they are guided through a guide plate, and, in the form of swarf, cause short circuits in an electrical device.

SUMMARY

According to an example embodiment of the present invention, in a direction extending through the thickness of the guide plate, the aperture includes a guide shaft. The guide shaft includes at least one planar wall, for guiding a flat side of the contact wire. The guide shaft also includes, on the opposite side to the planar wall, at least one wall region that extends obliquely to it and is configured to touch a corner of the contact wire. Furthermore preferably, the guide shaft is configured to press the corner of the contact wire against the oblique wall region as the contact wire is guided through the aperture, and in so doing to reshape, specifically to bend, a burr which is formed on the corner. Advantageously, the flat side of the guide shaft may ensure the correct flat guidance of the contact wire. In conjunction with guidance by the planar wall region, the oblique wall region opposite may bring about a high level of exactness in positioning the contact wire within the guide plate and thus also of positioning the mutually adjacent contact wires in relation to one another. Preferably, the contact wire takes the form of a punched sheet-metal part, which is, e.g., additionally bent and/or stamped by a shaping process. In this context, from a bearing side of a sheet-metal blank, which is provided for the manufacture of contact wires, a punch-cutting tool is laid on the surface and, co-operating with a counter-cutting tool, e.g., a die, shears or cuts one or more contact wires out of the sheet-metal blank such that the contour is defined. As a result of the manufacturing process, a burr side at a respective sheared edge, which is the opposite side to the side bearing against the punch-cutting tool, then includes burrs, which stand proud of the respective sheared edge. The defined shape of the aperture can effectively prevent the burrs from shearing off as the contact wires are assembled by being passed through the aperture. For this purpose, the burr side of a contact wire faces the oblique wall region. Consequently, the bearing side of a contact wire faces the planar wall. In particular, this makes it possible, as the contact wire is guided through the aperture, for the abutment side to abut against the planar wall, and for the contact wire to be guided through the aperture with little mechanical load on its abutment side. It has further been found that the burrs on the burr side of a contact wire, which come into contact with the wall of the aperture as they are guided through, are, advantageously, not sheared off or separated but, rather, are merely bent at an angle as a result of these contact forces acting obliquely on them. Advantageously, in this way the burr may remain integrally formed on the contact wire, with the result that no detached particles of burr are produced in the form of swarf. In addition, the bent burr adopts a more favorable position, as a result of which it cannot break off so easily, even if the contact wire is subsequently guided through an aperture in a printed circuit board—for example in order to form a solder contact there. Thus, as a result of being bent, the burr may be folded against the contact wire, in particular against a flat side of the contact wire, which in turn has the result that the risk of forming swarf can be avoided very simply and effectively. In addition, after the contact wire has subsequently been guided through an aperture in a printed circuit board and a solder contact has been made there, the contact wire may be supported in the aperture with its abutment side lying against the planar wall. This may also be forced, e.g., by appropriately arranging the contact wire toward the printed circuit board such that, as a result of the arrangement, a pre-loading force acts in the contact wire, e.g., as a result of the contact wire being under tension, so that the pre-loading force moves the abutment side in the direction of the planar wall in the aperture, preferably until it makes an abutting contact. Because bearing is over a planar surface, the risk of whisker formation, which otherwise takes effect over time if there is a high load at a point, is significantly reduced, since in this case the burr side at the same time also remains as far away as possible from the oblique wall region.

Preferably, the contact wire is a copper wire, in particular made from copper or a copper alloy. In addition, it may be tin-plated—even if only in certain regions—or include a solderable and/or solder-wetting coating. Advantageously, in this way the contact wire may be provided at low cost.

Preferably, the aperture extends transversely to a plane of the plate. Advantageously, the guide plate may thus be pushed onto the contact wires, in particular contact pins.

In a preferred specific embodiment of the present invention, the wall region is in the shape of an arc in cross section, in particular in the shape of a circle arc. Advantageously, in this way a semicylindrical aperture wall may be formed. Advantageously, when pressed against the arc-shaped aperture wall, the burr may be bent evenly by the arc-shaped or circle-arc-shaped aperture wall.

In a preferred specific embodiment of the present invention, the wall region is V-shaped or roof-shaped. Advantageously, at the roof-shaped oblique face that is thus formed, the burr may be bent into an angular position corresponding to the oblique face.

In a preferred specific embodiment of the present invention, an angle of the V shape is between 60 and 160 degrees. Furthermore preferably, the angle of the V shape is at least 90 degrees. Advantageously, the burr may thus be bent to a considerable extent with a relatively small dimension of the aperture.

The aperture preferably includes an insertion funnel adjoined by the guide shaft. The insertion funnel makes it easier to insert or thread a contact wire through a respective aperture. In this context, even an orientation of the contact wire in relation to the aperture that is not axially centered may be compensated reliably. In a preferred specific embodiment, the insertion funnel is at least partly or entirely in the shape of a circular cone. Advantageously, in this way the insertion funnel may contain a shift in position by the contact wire that is uniform on all sides.

In a preferred specific embodiment of the present invention, the insertion funnel is at least partly or entirely in the shape of a pyramid. Advantageously, the insertion funnel may thus guide the contact wire to the guide shaft along a corner of the pyramid, which forms a guide channel.

In a preferred specific embodiment of the present invention, the insertion funnel includes, in the region of the planar wall side, a planar oblique face, the insertion funnel being formed on the side opposite this by a conical portion, in particular a frustoconical portion. Advantageously, the contact wire may thus be guided into the guide shaft along the planar oblique face, further preferably with the aid of two V-shaped channels delimiting the planar oblique face, and in the region of the conical portion be guided on the round or roof-shaped wall region for the purpose of deforming the burr.

In a preferred specific embodiment of the present invention, in the region of the planar wall side, the insertion funnel includes a planar oblique face, and on the side opposite this includes one or two guide channels. Advantageously, the contact wire may thus slide to the guide shaft with one corner of the contact wire in a pyramid corner, in particular a V-shaped channel of the pyramid corner.

In a preferred specific embodiment of the present invention, the connector includes a connector casing. The guide plate includes a recess for making a push-in connection with the connector casing. Advantageously, in this way the guide plate may be pushed onto the contact wires and be connected to the connector casing in a push-in connection, in particular in a latched connection.

In a preferred specific embodiment of the present invention, a longitudinal dimension of the aperture, in particular of the guide shaft, is—preferably as seen in the cross section of the aperture—the same as a transverse dimension of the aperture. Advantageously, the insertion funnel, and further preferably the guide shaft, may be given small external dimensions.

Preferably, the guide plate, or in addition the connector casing, may be made from plastics material. The plastics material is preferably a thermoplastic, e.g., polyamide, PMMA (polymethyl methacrylate), polycarbonate, POM (polyoxymethylene), or ABS (acrylonitrile butadiene styrene), PBT (polybutadiene terephthalate), or ASA copolymer (acrylonitrile styrene acrylate).

The present invention will be explained below with reference to figures and further examples of specific embodiments. Further advantageous variants of embodiments are derived from a combination of the features disclosed herein.

BRIEF DESCRIPTION OF THE DRAWINGS

FIG. 1 shows, schematically, an example of a specific embodiment of a contact system in accordance with the present invention, comprising a guide plate for a connector and a contact wire, the guide plate including an aperture with a round wall region, which is configured to reshape a burr on the contact wire.

FIG. 2 shows, schematically, an example of a specific embodiment of a contact system in accordance with the present invention, comprising a guide plate for a connector and a contact wire, the guide plate including an aperture with a roof-shaped wall region, which is configured to reshape a burr on the contact wire.

DETAILED DESCRIPTION OF EXAMPLE EMBODIMENTS

Figure 3:
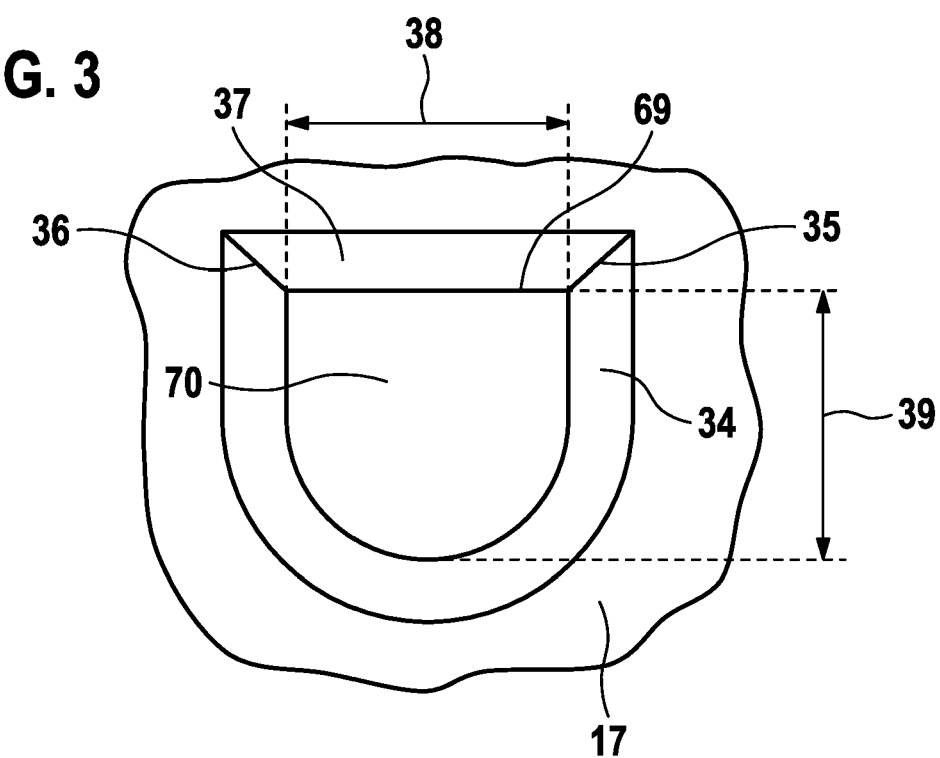
FIG. 3 shows, schematically, an example of a specific embodiment of an aperture in a guide plate in accordance with the present invention, the aperture being configured to reshape a burr on a contact wire, the aperture including an insertion funnel comprising a funnel wall with planar and curved regions along the funnel periphery.

FIG. 1 shows an example of a specific embodiment of a contact system 1. Contact system 1 includes a guide plate 2. Guide plate 2 includes at least one aperture 3. Aperture 3 is configured to guide a contact wire 4 through, and forms a guide shaft for contact wire 4. In this example of a specific embodiment, contact wire 4 has a quadrilateral, in particular rectangular, cross section. Contact wire 4 includes an, in particular, flat side 5. Flat side 5 corresponds, in particular, to an abutment side for a punch-cutting tool at the time of manufacturing contact wire 4. On the side opposite side 5, contact wire 4 includes two corners 6 and 7. A burr 8 is formed on corner 6, and a burr 9 is formed on corner 7. In this example of a specific embodiment, burrs 8 and 9 are produced at the time of stamping contact wire 4 out of a metal sheet with the aid of a punching tool, during which a punching tool stamped out wire 4, including side 5, from side 5 to corners 6 and 7. In this context, burrs 8 and 9 have been produced at the corners. The side opposite flat side 5 accordingly corresponds to a burr side of contact wire 4, the production of a burr side being inherent in the manufacturing process.

Aperture 3 includes a planar aperture wall 10, which forms an inner face of aperture 3. On the side opposite planar wall 10, aperture 3—and hence also guide plate 2—includes a concave aperture wall 11. Wall 10 and concave wall 11 each form a portion of the periphery of the inner face of aperture 3.

Aperture 3 has a longitudinal dimension 13 and, transversely to this, a transverse dimension 14. In this example of a specific embodiment, longitudinal dimension 13 corresponds to transverse dimension 14. In this example of a specific embodiment, a curvature of concave aperture wall 11, which lies opposite planar aperture wall 10, has a radius of curvature 15. In this example of a specific embodiment, radius of curvature 15 is half as long as transverse dimension 14, and thus also half as long as longitudinal dimension 13.

As it is inserted into aperture 3, contact wire 4 may abut with its flat side 5, which is arranged on the opposite side to burrs 8 and 9, against planar wall 10, and while abutting against this may slide into aperture 3. During this, burrs 8 and 9 are bent toward one another against round aperture wall 11, in particular against the oblique face 12 formed by the rounding. In this way-in particular as contact wire 4 is inserted further into an aperture in a printed circuit board—burrs 8 and 9 can no longer strike against an aperture edge in the printed circuit board and be disadvantageously broken off there.

FIG. 2 shows an example of a specific embodiment of a guide plate 22, which includes an aperture 21. Aperture 21 is configured to guide a contact wire 27 through, and forms a guide shaft for contact wire 27. Aperture 21 includes a planar aperture wall 23, which takes the form of a peripheral portion along an inner wall periphery of aperture 21. On the side opposite planar aperture wall 23, aperture 21 includes an aperture wall that is V-shaped or roof-shaped in cross section. In this case, the V-shaped aperture wall comprises an aperture wall 24, which is oblique in relation to planar aperture wall 23, and an aperture wall 25, which is at a specifiable angle 26 to aperture wall 24. Aperture walls 24 and 25 each form a limb of the V shape, as seen in a cross section of aperture 21. A perpendicular line 20, which extends from the point at which limbs 24 and 25 intersect as far as planar wall 23 opposite, extends at a right angle to planar wall 23, and in this example of a specific embodiment forms a line that bisects angle 26 and extends between aperture walls 24 and 25, each arranged obliquely to planar wall 23.

In this example of a specific embodiment, a contact wire 27 is inserted into aperture 21. Contact wire 27 includes a flat side 16, which in this example of a specific embodiment hugs planar wall 23 as it is inserted into aperture 21. Flat side 16 corresponds in particular to an abutment side for a punch-cutting tool at the time of manufacturing contact wire 27. On the opposite side to flat side 16—which is in particular a burr side of the contact wire—contact wire 27 includes two corners 28 and 29. A burr 31 is formed on corner 28, and a burr 30 is formed on corner 29. On insertion into aperture 21, the burrs are bent at an angle and thus toward one another by the V-shaped aperture wall, which is formed by wall parts 24 and 25.

In this example of a specific embodiment, a transverse dimension 32 of aperture 21 corresponds to a longitudinal dimension 33 of aperture 21. In another specific embodiment, aperture 21 may have a larger longitudinal dimension, which is unequal to the maximum width dimension of the aperture, in particular being larger or smaller than this.

FIG. 3 shows an example of a specific embodiment of a guide plate 17. Guide plate 17 includes an aperture 70 for receiving a contact wire. In this example of a specific embodiment, aperture 70 forms a guide shaft for a contact wire. In this example of a specific embodiment, aperture 70 includes an insertion funnel 34. Aperture 70 also includes a planar aperture wall 69. In the region of planar wall 69, insertion funnel 34 includes a planar oblique face 37, which extends at a specific angle to planar wall 69. In this way, a contact wire may slide into aperture 70 with an edge, which is formed on a front face, against planar oblique face 37. Planar oblique face 37 is delimited by two channels 35 and 36, in particular guide channels.

Channels 35 and 36 form a delimitation between oblique funnel wall 37 and a remaining funnel region along the funnel periphery. In this example of a specific embodiment, oblique face 37, together with channels 35 and 36 and the funnel wall respectively adjoining channels 35 and 36, forms a part or a half of a frustoconical pyramid. At oblique funnel wall 37, which extends obliquely at a specific angle with respect to planar aperture wall 69, insertion funnel 34 takes the shape of a frustum of a half-cone, in particular a frustum of a circular half-cone. On insertion into aperture 70, two corners of a contact wire may slide into aperture 70 against the thus formed funnel wall.

In this example of a specific embodiment, aperture 70 has a longitudinal dimension 38 that is of the same size as a transverse dimension 39 extending transversely to it.

In another specific embodiment, aperture 70 may have a maximum longitudinal dimension that is unequal to the maximum width dimension of the aperture, in particular being larger or smaller than this.

Insertion funnel 34, which is shown in FIG. 3, may be formed on aperture 3 on guide plate 2, which is shown in FIG. 1. In this case, aperture 3 replaces aperture 70 in FIG. 3.

Figure 4:
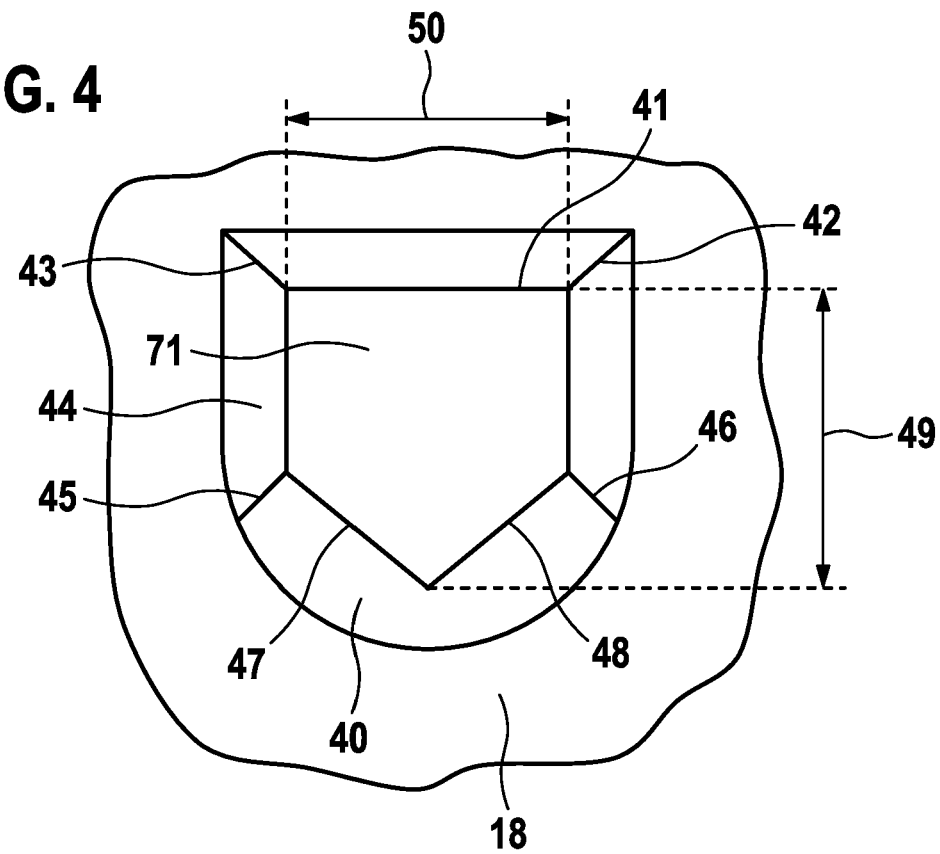
FIG. 4 shows, schematically, an example of a specific embodiment of an aperture in a guide plate in accordance with the present invention, the aperture being configured to reshape a burr on a contact wire, the aperture including an insertion funnel comprising a funnel wall with guide channels along the funnel periphery.

FIG. 4 shows an example of a specific embodiment of an insertion funnel 44. Insertion funnel 44 surrounds an aperture 71 and is configured to capture a contact wire for the purpose of guiding it through aperture 71.

Aperture 71, which in this example of a specific embodiment forms a guide shaft for the contact wire, and insertion funnel 44 surrounding it are made in a guide plate 18. Aperture 71 includes a planar aperture wall 41, opposite which, as seen in cross section, two aperture walls 47 and 48, each of which forms a limb of a V, are arranged. In this example of a specific embodiment, insertion funnel 44 includes four channels 42, 43, 45 and 46, in particular guide channels, each of which runs into an aperture corner of aperture 71. Advantageously, in this way a corner of a guide wire may be guided into aperture 71 in one of the channels, in the direction of a longitudinal extent of the channel. On the opposite side to planar aperture wall 41, insertion funnel 44 includes a round edge region 40. In this example of a specific embodiment, funnel wall region 40 takes the form of a frustoconical segment, in particular a circular frustoconical segment.

In this example of a specific embodiment, a transverse dimension 49 of aperture 71, which is formed transversely in relation to a longitudinal dimension of aperture 41, is exactly the same length as the longitudinal dimension 50. In this example of a specific embodiment, longitudinal dimension 50 corresponds to the longitudinal extent of planar aperture wall 41, as seen in the cross section of aperture 71. In this example of a specific embodiment, transverse dimension 49 corresponds to a longitudinal dimension of a perpendicular line from an apex formed by oblique faces 47 and 48 to planar aperture wall 41.

In another specific embodiment, aperture 71 may have a maximum longitudinal dimension that is unequal to the maximum width dimension of the aperture, in particular being larger or smaller than this.

Insertion funnel 44, which is shown in FIG. 4, may be implemented on guide plate 22, which is shown in FIG. 2. In this case, aperture 21 in FIG. 2 replaces aperture 71, which is shown in FIG. 4. In this way, insertion funnel 44 surrounds aperture 21, which is shown in FIG. 2. Planar aperture wall 41, which is shown in FIG. 4, in this case replaces planar aperture wall 23, which is shown in FIG. 2, and aperture wall 47, which is arranged obliquely in respect of planar aperture wall 41 and opposite it, replaces aperture wall 24, and oblique aperture wall 48 replaces aperture wall 25. In this way, contact wire 27 may be captured in insertion funnel 44 and may slide reliably into aperture 21. Then, burrs 30 and 31 are bent in the roof-shaped region of aperture 71 that is formed by oblique aperture walls 47 and 48.

Figure 5:
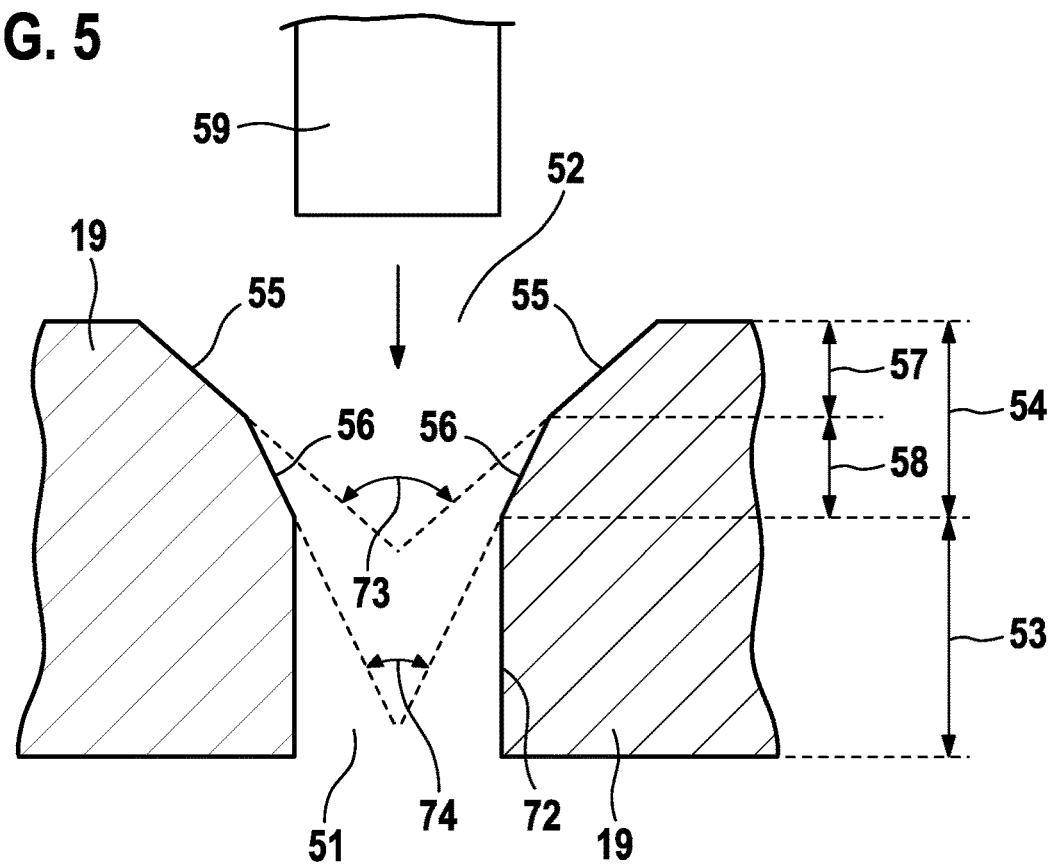
FIG. 5 shows, schematically, an example of a specific embodiment of the present invention of an aperture in a guide plate in a sectional view, the aperture being configured to reshape a burr on a contact wire, an insertion funnel being of stepped configuration.

FIG. 5 shows an example of a specific embodiment of an aperture 51, which comprises an insertion funnel 52 and is made in a guide plate 19. Aperture 51 includes a guide shaft 72. Guide shaft 72 has, e.g., as seen in cross section, the shape and dimension of one of the apertures according to FIG. 1 or FIG. 2 that were described above.

In this example of a specific embodiment, insertion funnel 52 in FIG. 5 is configured to have a stepped angle of insertion. Insertion funnel 52 includes a funnel wall region 55 at a specified funnel angle 73.

In this example of a specific embodiment, a longitudinal extent 53 of guide shaft 72 of the aperture in guide plate 19 is larger than a longitudinal extent 54 of insertion funnel 52 in a direction extending through the thickness of guide plate 19.

Insertion funnel 52 includes a funnel wall region 56 of which funnel angle 74 is smaller than funnel angle 73 of funnel wall region 55. Funnel wall region 56 extends between funnel wall region 55 and guide shaft 72.

In this way, funnel wall region 55 forms a first funnel step, which is adjoined by a second funnel step formed by funnel wall region 56. The second funnel step, formed by funnel wall 56, is configured to gradually bend a burr, e.g., burr 8 or 9 shown in FIG. 1, or burr 30 or 31 shown in FIG. 2, while a contact wire 59 on which such a burr may be formed is inserted, and in this way to fold it against contact wire 59. Burr 8 or 9 may thus be reshaped.

In this example of a specific embodiment, a longitudinal dimension 58 of the second funnel step corresponds to a longitudinal dimension 57 of the first funnel step, in each case in the direction extending through the thickness of guide plate 19.

Figure 6:
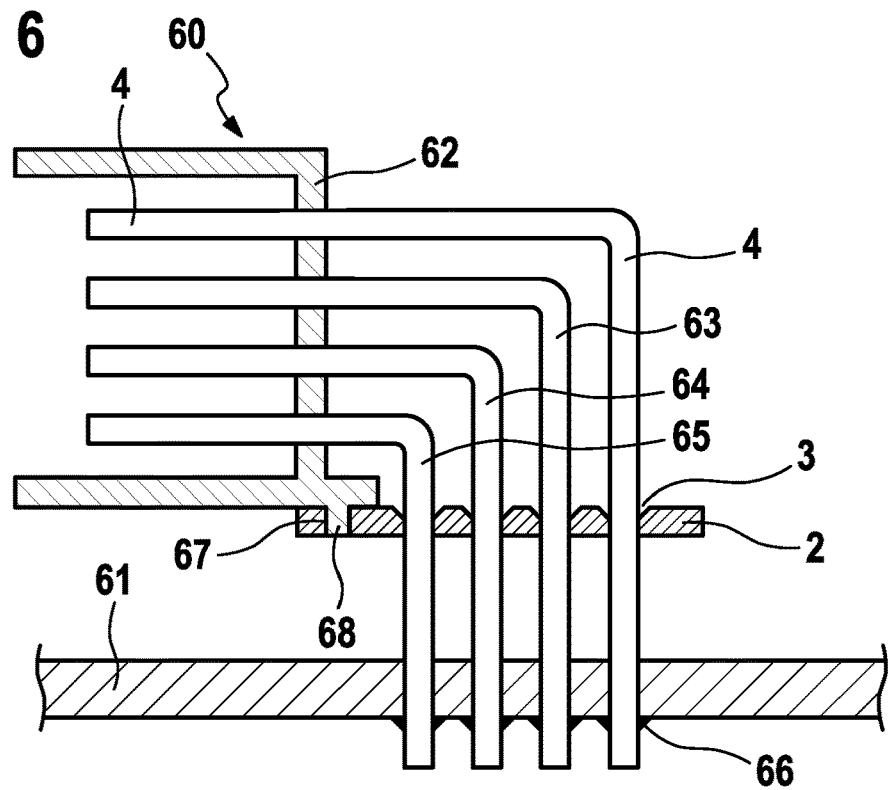
FIG. 6 shows, schematically, an example of a specific embodiment of the present invention of a connector comprising a guide plate through which contact wires of the connector are guided.

FIG. 6 shows an example of a specific embodiment of a connector 60, which is shown in sectional view. Connector 60 includes a connector casing 62, in particular a plastics casing. Connector 60 also includes a plurality of contact wires, in this example of a specific embodiment four contact wires. One of the contact wires is, e.g., contact wire 4, which has already been shown in FIG. 1. One end portion of contact wire 4 extends into a connector receptacle of connector 60, the connector receptacle being configured to make contact with a mating connector. An end of contact wire 4 that is opposite this extends such that it is bent away from casing 62, and is configured to be soldered to a printed circuit board 61.

In this example of a specific embodiment, connector 60 comprises further contact wires 63, 64 and 65, each of which extends parallel to contact wire 4 such that they are spaced apart. Contact wires 4, 63, 64 and 65 are in each case guided through an aperture made in a guide plate 2 for the respective contact wire. Guide plate 2 may be part of connector 60. For the purpose of connection to guide plate 2, connector 60 includes a projection 68, which is configured to engage in a recess 67 in guide plate 2. In this way, guide plate 2 may be pushed onto projection region 68 and thus be force-fittingly and/or form-fittingly connected to casing 62.

In this context, contact wire 4 is guided through aperture 3 in guide plate 2. Aperture 3 may in this context be formed in guide plate 2, in a manner corresponding to aperture 3 in FIG. 1. As an alternative, the configuration may also be adapted to an aperture as disclosed in FIG. 2. In this way, burrs that are formed on contact wire 4 or on further contact wires 63, 64 or 65 may be deformed such that they are bent at the oblique wall region of the aperture. The contact wires of connector 60 may then be guided into respective apertures in printed circuit board 61, in particular a THT (through-hole technology) printed circuit board, and soldered to printed circuit board 61 with the aid of a solder 66. In the soldered state, contact wires 4, 63, 64, 65 are in an arrangement between the connector and printed circuit board 61 that is, in particular, under slight tension, so that a pre-loading force acts within them, this pre-loading force moving contact wires 4, 63, 64, 65 toward the respective planar wall 5, 16 in the aperture 3, 21 through which they pass, in particular causing them to abut against respective planar wall 5, 16. In this case, a contact wire 4, 63, 64, 65 is oriented in guide plate 2, 22, within an aperture 3, 21 through which it passes, such that abutment side 5 of contact wire 4, 63, 64, 65 is facing planar wall 10, 23, and the burr side is facing concave aperture wall 11 or oblique aperture wall 24, 25, as applicable.

In this way, advantageously it is not possible for connector 60 to cause a short circuit as a result of any burr swarf that comes off a contact wire. In addition, whisker formation during operation of connector 60 is significantly reduced.

What is claimed is:

1. A connector, comprising:
a guide plate which is configured to be electrically insulating, the guide plate including a plurality of electrical contact wires, which are stamped, each contact wire of the contact wires having a quadrilateral cross section, being guided through a respective aperture in the guide plate and projecting from the guide plate;
wherein, in a direction extending through a thickness of the guide plate, each respective aperture includes a guide shaft, the guide shaft including at least one planar wall configured to guide a flat side of the contact wire, and the guide shaft also includes, on an opposite side to the planar wall, at least one wall region that extends obliquely to it and is configured to touch a corner of the contact wire, and the guide shaft being configured to press the corner against the oblique wall region as the contact wire is guided through, and in so doing to bend a burr which is formed on the corner.

2. The connector as recited in claim 1, wherein the wall region is in a shape of an arc in cross section.

3. The connector as recited in claim 1, wherein the wall region is in the shape of a circular arc in cross section.

4. The connector as recited in claim 1, wherein the wall region is V-shaped or roof-shaped.

5. The connector as recited in claim 4, wherein the wall region is V-shaped, and wherein an angle of the V shape is between 60 and 160 degrees.

6. The connector as recited in claim 5, wherein the angle is at least 90 degrees.

7. The connector as recited in claim 5, wherein each respective aperture includes an insertion funnel adjoined by the guide shaft.

8. The connector as recited in claim 7, wherein the insertion funnel is at least partly in a shape of a circular cone.

9. The connector as recited in claim 7, wherein the insertion funnel is at least partly in a shape of a pyramid.

10. The connector as recited in claim 7, wherein the insertion funnel includes, in the region of the planar wall side, a planar oblique face, and on an side opposite is formed by a conical portion.

11. The connector as recited in claim 7, wherein, in a region of the planar wall side, the insertion funnel includes a planar oblique face, and on a side opposite the plan oblique face includes guide channels.

12. The connector as recited in claim 1, wherein the connector includes a connector casing, and the guide plate includes a recess for making a push-in connection with the connector casing.

13. The connector as recited in claim 1, wherein a longitudinal dimension of each respect aperture is the same as a transverse dimension of the respective aperture.

\* \* \* \* \*